(12) United States Patent
Mori et al.

(10) Patent No.: US 10,829,643 B2
(45) Date of Patent: Nov. 10, 2020

(54) GAS BARRIER FILM

(71) Applicant: Toray Industries, Inc., Tokyo (JP)

(72) Inventors: Kentaro Mori, Otsu (JP); Hiroyuki Uebayashi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 613 days.

(21) Appl. No.: 14/759,829

(22) PCT Filed: Dec. 25, 2013

(86) PCT No.: PCT/JP2013/084626
§ 371 (c)(1),
(2) Date: Jul. 8, 2015

(87) PCT Pub. No.: WO2014/109231
PCT Pub. Date: Jul. 17, 2014

(65) Prior Publication Data
US 2015/0337139 A1   Nov. 26, 2015

(30) Foreign Application Priority Data

Jan. 11, 2013  (JP) .................................. 2013-003089
Nov. 15, 2013  (JP) .................................. 2013-236569

(51) Int. Cl.
*C09D 1/00*   (2006.01)
*C23C 14/08*  (2006.01)
(Continued)

(52) U.S. Cl.
CPC .............. *C09D 1/00* (2013.01); *C08J 7/0423* (2020.01); *C23C 14/08* (2013.01); *C23C 14/086* (2013.01);
(Continued)

(58) Field of Classification Search
USPC ....................................................... 428/411.1
See application file for complete search history.

(56) References Cited

U.S. PATENT DOCUMENTS 6,979,493 B2 * 12/2005 Uchida .............. C08G 18/0823
428/423.1
9,090,780 B2   7/2015 Uebayashi et al.
(Continued)

FOREIGN PATENT DOCUMENTS

EP     2772353    9/2015
JP     08142252   6/1996
(Continued)

OTHER PUBLICATIONS

Kondou et al., WO-2012114713-A1, Machine Translation (Year: 2012).*

(Continued)

Primary Examiner — Callie E Shosho
Assistant Examiner — Patrick N English
(74) Attorney, Agent, or Firm — RatnerPrestia

(57) ABSTRACT

The gas barrier film includes a polymer base having an inorganic layer [A] and a silicon compound layer [B] stacked in this order at least on one side of the polymer base, the inorganic layer [A] containing a zinc compound and silicon oxide, the silicon compound layer [B] containing silicon oxynitride, and the inorganic layer [A] and the silicon compound layer [B] being in contact with each other.

10 Claims, 3 Drawing Sheets

(51) Int. Cl.
*C08J 7/04* (2020.01)
*H01L 51/52* (2006.01)

(52) U.S. Cl.
CPC ........ *C08J 2365/00* (2013.01); *C08J 2367/02* (2013.01); *C08J 2475/04* (2013.01); *C08J 2483/16* (2013.01); *H01L 51/524* (2013.01); *Y10T 428/31598* (2015.04)

(56) References Cited

U.S. PATENT DOCUMENTS

| | | | |
|---|---|---|---|
| 9,219,018 B2 | 12/2015 | Uebayashi et al. | |
| 2005/0037240 A1* | 2/2005 | Haoto | C23C 14/0676 428/698 |
| 2008/0026597 A1 | 1/2008 | Munro et al. | |
| 2010/0132762 A1* | 6/2010 | Graham, Jr. | C23C 16/0272 136/244 |
| 2011/0151173 A1* | 6/2011 | Ramadas | C23C 14/0073 428/76 |
| 2012/0107607 A1 | 5/2012 | Takaki | |
| 2012/0288708 A1 | 11/2012 | Arai | |
| 2014/0026961 A1 | 1/2014 | Uebayashi | |
| 2014/0370260 A1 | 12/2014 | Uebayashi et al. | |

FOREIGN PATENT DOCUMENTS

| | | | | |
|---|---|---|---|---|
| JP | 2002113826 | | 4/2002 | |
| JP | 2009539265 A | | 11/2009 | |
| JP | 4407466 | | 2/2010 | |
| JP | 2011201302 | | 10/2011 | |
| JP | 2011201302 A | * | 10/2011 | |
| JP | 2012206507 | | 10/2012 | |
| JP | 2013047363 A | | 3/2013 | |
| WO | 2008035557 | | 3/2008 | |
| WO | 2011004698 | | 1/2011 | |
| WO | 2011007543 | | 1/2011 | |
| WO | WO-2012114713 A1 | * | 8/2012 | ............. C04B 35/16 |
| WO | 2012137662 | | 10/2012 | |
| WO | 2013061726 | | 5/2013 | |

OTHER PUBLICATIONS

Tsukamura et al., JP-2011201302-A. Machine Translation (Year: 2011).*
International Search Report for International Application No. PCT/JP2013/084626 dated Apr. 15, 2014.
Final Office Action for U.S. Appl. No. 14/781,158, dated Dec. 19, 2017, 7 pages.
Notification of Reasons for Refusal for Japanese Application No. 2014-520421, dated Oct. 17, 2017 with translation, 7 pages. 2017.
Non Final Office Action for U.S. Appl. No. 14/781,158, dated Jul. 10, 2017, 17 pages.

* cited by examiner

[Fig. 1]
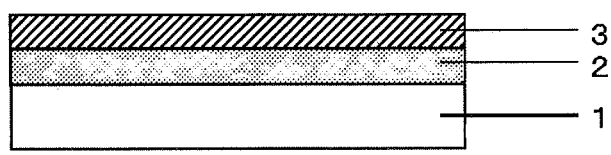
[Fig. 2]
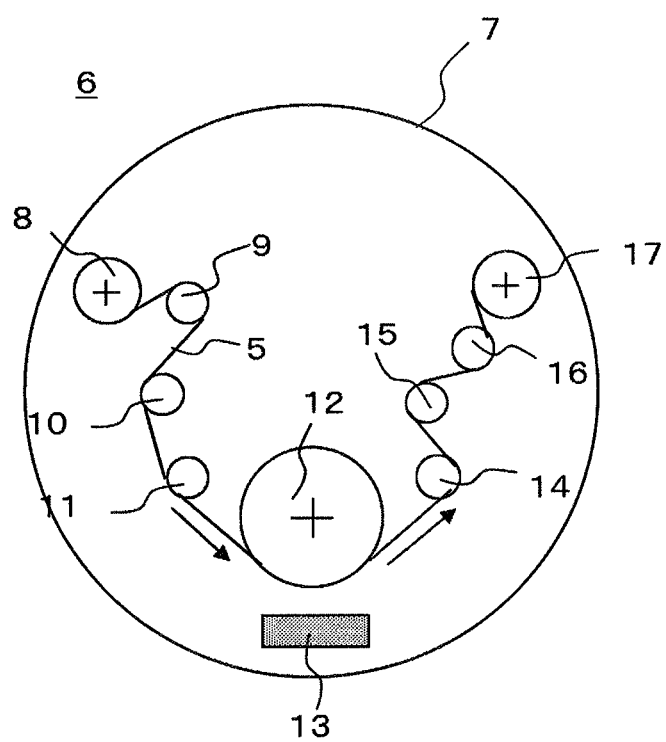

[Fig. 3]
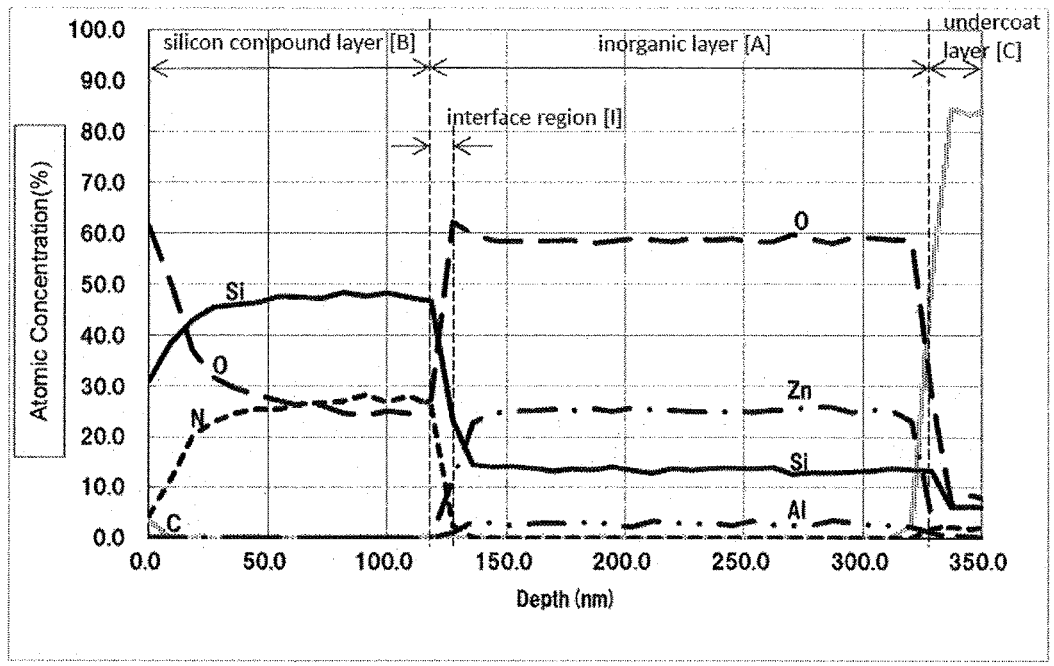
[Fig. 4]
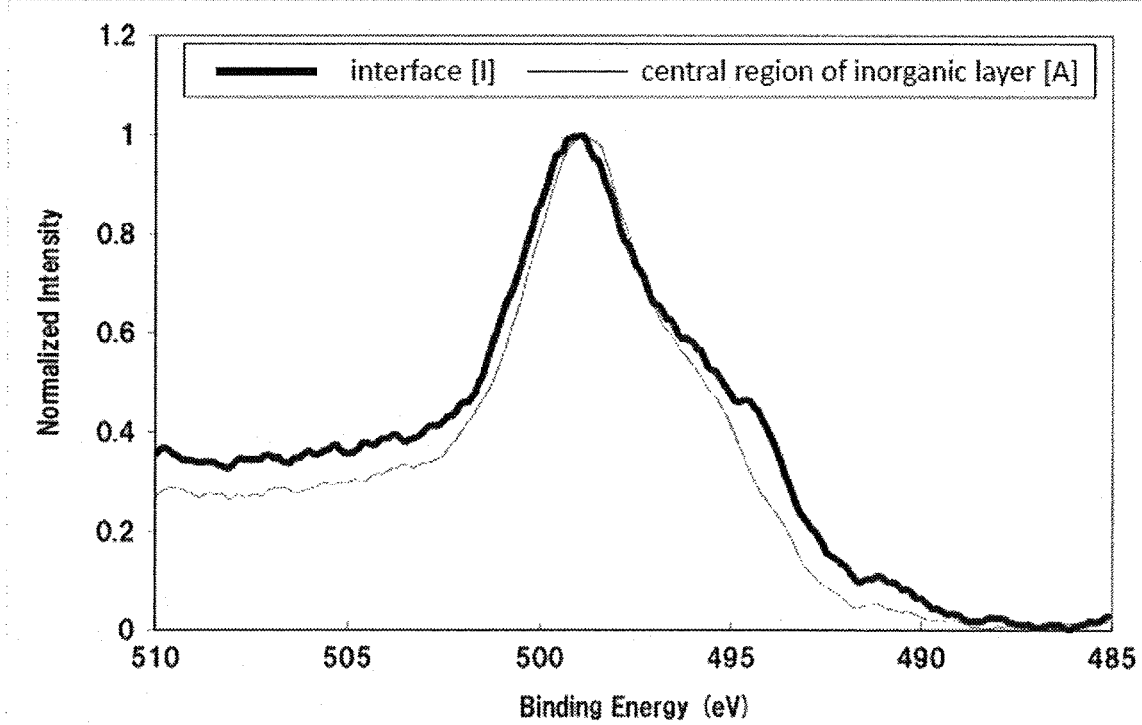

[Fig. 5]
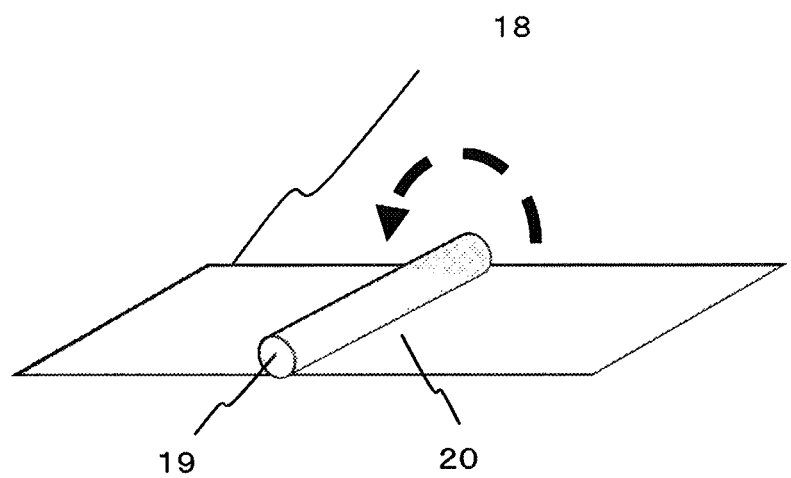
[Fig. 6]
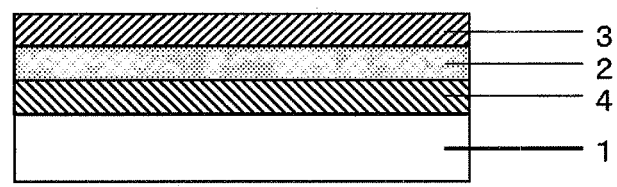

GAS BARRIER FILM

CROSS REFERENCE TO RELATED APPLICATION

This is the U.S. National Phase application of PCT/JP2013/084626, filed Dec. 25, 2013, which claims priority to Japanese Patent Application No. 2013-003089, filed Jan. 11, 2013, and Japanese Patent Application No. 2013-236569, filed Nov. 15, 2013, the disclosures of each of these application being incorporated herein by reference in their entireties for all purposes.

FIELD OF THE INVENTION

The present invention relates to gas barrier film to be used for packaging of foodstuffs and pharmaceuticals, electronic devices such as solar battery, electronic paper, and organic electroluminescent (EL) displays, and other materials that are required to have high gas barrier properties.

BACKGROUND OF THE INVENTION

Gas barrier films that contain a polymer base having an layer of an inorganic substance (or inorganic oxide) such as aluminum oxide, silicon oxide, and magnesium oxide deposited on a surface thereof by a physical vapor deposition (PVD) technique such as vacuum deposition, sputtering, and ion plating, or a chemical vapor deposition (CVD) technique such as plasma chemical vapor deposition, thermochemical vapor deposition, and photochemical vapor deposition have been used as materials for packaging of foodstuffs and pharmaceuticals and for electronic devices such as flat-screen televisions and solar batteries that are required to be impermeable to various gases including water vapor and oxygen.

Gas barrier properties improvement techniques that have already been disclosed include, for example, forming a compound composed mainly of silicon oxide and containing at least one element selected from the group consisting of carbon, hydrogen, silicon, and oxygen on a base by the plasma CVD technique using a gas mixture containing vapor of an organic silicon compound and oxygen to achieve improved gas barrier properties while maintaining transparency (Patent document 1). Other gas barrier properties improvement techniques that do not use a film formation process such as plasma CVD include the use of a smooth-surfaced base or a base with an undercoat layer that provides a smooth surface free from protrusions and irregularities likely to cause pinholes and cracks that deteriorate the gas barrier properties (Patent documents 2, 3, 4) and the use of a silicon oxide film or silicon oxynitride film produced through the conversion from a polysilazane film formed by wet coating (Patent documents 5 and 6).

Patent Documents

Patent document 1: Japanese Unexamined Patent Publication (Kokai) No. HEI 8-142252
Patent document 2: Japanese Unexamined Patent Publication (Kokai) No. 2002-113826
Patent document 3: International Publication WO 2012/137662
Patent document 4: International Publication WO 2013/061726
Patent document 5: International Publication WO 2011/007543
Patent document 6: International Publication WO 2011/004698

SUMMARY OF THE INVENTION

However, the method of forming a layer with gas barrier properties containing silicon oxide as primary component by the plasma CVD technique as proposed in Patent document 1 cannot always ensure stable gas barrier properties because the film properties of the resulting gas barrier layer will be largely dependent on the type of base material used. A solution to the stabilization of gas barrier properties is thickening of the film, but this will lead to problems such as a decrease in flex resistance and an increase in production cost. The method in which a smooth-surfaced base or a base provided with an undercoat layer that provides a smooth surface is used to form a gas barrier layer as proposed in Patent document 2 cannot achieve an expected enhancement of gas barrier properties although effective in preventing the formation of pinholes and cracks. Compared to these, the methods proposed in Patent documents 3 and 4 have the problem of the difficulty in stably developing high gas barrier properties although some improvement in performance can be realized as a result of the improvement in film properties of the gas barrier layer. In the case of the method of using a polysilazane layer to form a layer with gas barrier properties as proposed in Patent documents 5 and 6, furthermore, the layer production conditions can have large influence and a plurality of polysilazane layers have to be stacked to ensure stable formation of gas barrier film having required gas barrier properties, possibly causing problems such as deterioration in flex resistance and increase in production cost.

In view of the background relating to such conventional techniques, an object of the present invention is to provide gas barrier film that achieves excellent gas barrier properties and high flex resistance without increasing the film thickness or forming a multi-layered structure.

The present invention adopts the following measures to solve one or more of these problems. Specifically:

(1) Gas barrier film including a polymer base having an inorganic layer [A] and a silicon compound layer [B] stacked in this order at least on one side of the polymer base, the inorganic layer [A] containing a zinc compound and silicon oxide, the silicon compound layer [B] containing silicon oxynitride, and the inorganic layer [A] and the silicon compound layer [B] being in contact with each other.

(2) Gas barrier film as described in paragraph (1) wherein the polymer base and the inorganic layer [A] sandwich an undercoat layer [C] that contains a structure in the form of a crosslinked product of a polyurethane compound [C1] having an aromatic ring structure.

(3) Gas barrier film as described in either paragraph (1) or (2) wherein the inorganic layer [A] is either an inorganic layer [A1] that includes a coexistence phase of zinc oxide, silicon dioxide, and aluminum oxide or an inorganic layer [A2] that includes a coexistence phase of zinc sulfide and silicon dioxide.

(4) Gas barrier film as described in paragraph (3) wherein the inorganic layer [A] is the inorganic layer [A1] and the layer [1] has a zinc atom concentration of 20 to 40 atom %, a silicon atom concentration of 5 to 20 atom %, an aluminum atom concentration of 0.5 to 5 atom %, and an oxygen atom concentration of 35 to 70 atom % as determined by ICP emission spectroscopy analysis.

(5) Gas barrier film as described in paragraph (3) wherein the inorganic layer [A] is the inorganic layer [A2] in which zinc sulfide accounts for a mole fraction of 0.7 to 0.9 of the total for zinc sulfide and silicon dioxide.

(6) Gas barrier film as described in any one of paragraphs (1) to (5) wherein in the silicon compound layer [B], the oxygen atom has an atomic composition ratio of 0.1 or more and less than 2.0 relative to the silicon atom and the nitrogen atom has an atomic composition ratio of 0.1 or more and less than 1.0 relative to the silicon atom based on element distributions observed by X-ray photoelectron spectroscopy.

(7) Gas barrier film as described in any one of paragraphs (2) to (6) wherein the undercoat layer [C] contains an organic silicon compound and/or an inorganic silicon compound.

(8) An electronic device including gas barrier film as described in any one of paragraphs (1) to (7).

(9) A production method for gas barrier film including a step, referred to as step a, for forming an inorganic layer [A] containing a zinc compound and silicon oxide on a polymer base by sputtering and a step, referred to as step b, for forming a silicon compound layer [B] containing silicon oxynitride on the inorganic layer [A] by spreading a coating liquid containing a silicon compound having a polysilazane backbone, then drying it to form a coat film, and subsequently applying an active energy ray to the coat film in a nitrogen atmosphere.

(10) A production method for gas barrier film including a step, referred to as step c, for forming an undercoat layer [C] on a polymer base by spreading a coating liquid containing a polyurethane compound [C1] having an aromatic ring structure, then drying it to form a coat film, and subsequently applying an active energy ray to the coat film in a nitrogen atmosphere, step a for forming an inorganic layer [A] containing a zinc compound and silicon oxide on the undercoat layer [C] by sputtering, and step b for forming a silicon compound layer [B] containing silicon oxide and silicon oxynitride on the inorganic layer [A] by spreading a coating liquid containing a silicon compound having a polysilazane backbone, then drying it to form a coat film, and subsequently applying an active energy ray to the coat film in a nitrogen atmosphere.

It is possible to provide gas barrier film that has high gas barrier properties against water vapor and high flex resistance.

BRIEF DESCRIPTION OF THE DRAWINGS

FIG. 1 is a cross-sectional diagram of an example of the gas barrier film according to the present invention.

FIG. 2 is a schematic diagram of a take-up type sputtering apparatus designed for the production of the gas barrier film according to the present invention.

FIG. 3 gives a graph showing element distributions in the gas barrier film produced in Example 1 of the present invention, measured by X-ray photoelectron spectroscopy in the depth direction from the surface of the silicon compound layer [B] toward the inorganic layer [A].

FIG. 4 gives a graph showing a ZnLMM spectrum obtained by X-ray photoelectron spectroscopy from the interface region [I] between the inorganic layer [A] and the silicon compound layer [B] defined in the graph in FIG. 3.

FIG. 5 is a schematic diagram showing the procedure of flex resistance test.

FIG. 6 is a cross-sectional diagram of an example of the gas barrier film according to the present invention.

DETAILED DESCRIPTION OF EMBODIMENTS OF THE INVENTION

As a result of intensive studies aiming to produce gas barrier film having high gas barrier properties against water vapor etc. and high flex resistance, the inventors have found that the above problem can be solved by stacking an inorganic layer [A] containing a zinc compound and silicon oxide and a silicon compound layer [B] containing silicon oxynitride in this order on at least on one side of a polymer base.

FIG. 1 is a cross-sectional diagram of an example of the gas barrier film according to an embodiment of the present invention. The gas barrier film according to an embodiment of the present invention includes an inorganic layer [A] containing a zinc compound and silicon oxide and a silicon compound layer [B] containing silicon oxynitride that are in contact with each other and stacked on one side of a polymer base 1 in this order from the polymer base 1. Here, the example given in FIG. 1 is intended only to show the minimum structure of the gas barrier film according to the present invention, in which only an inorganic layer [A] and an silicon compound layer [B] are located on one side of a polymer base 1, but another layer may exist between the polymer base and the inorganic layer [A], or another layer may exist on the opposite side of the polymer base 1 to the one that is provided with the inorganic layer [A].

The boundary between the inorganic layer [A] and the silicon compound layer [B] is described below with reference to FIG. 3. The graph given in FIG. 3 illustrates element distributions in an example of the gas barrier film according to an embodiment of the present invention, measured by X-ray photoelectron spectroscopy in the direction of depth (showing as Depth in the figure) from the surface of the silicon compound layer [B], which assumes to be 0.0 nm deep, toward the inorganic layer [A]. The inorganic layer [A] contains zinc, but the atomic concentration (shown as Atomic Concentration (%) in the figure) of zinc decreases near the silicon compound layer [B]. Here, the plane where the atomic concentration of zinc comes to a minimum is defined as the boundary between the inorganic layer [A] and the silicon compound layer [B]. Features of the interface region [I] including its definition will be described later.

The reason why such a noticeable effect of the present invention can be realized is inferred as follows. Specifically, stacking the inorganic layer [A] and the silicon compound layer [B] in such a manner that they are in contact with each other allows the defects such as pinholes and cracks located within the inorganic layer [A] near its surface in contact with the silicon compound layer [B] to be filled with silicon oxynitride coming from the silicon compound layer [B], thereby developing high barrier properties. The formation of the silicon compound layer [B] in contact with the inorganic layer [A] allows some components, such as zinc oxide, of the inorganic layer [A] to act as catalyst for improving the film properties of the silicon compound layer [B], thereby ensuring improved gas barrier properties. In addition, some components of the inorganic layer [A] and those of the silicon compound layer [B] may form chemical bonds to realize a firm contact between the inorganic layer [A] and the silicon compound layer [B], leading to increased flex resistance.

[Polymer Base]

The polymer base used for at least one embodiment of the present invention is preferably in the form of a film from the viewpoint of ensuring flexibility. The film may be in the form of a monolayer film or a bi- or multi-layered film produced by, for example, coextrusion. In regard to film type, it may be a uniaxially or biaxially stretched film.

There are no specific limitations on the material of the polymer base used for the present invention, but it is preferably composed mainly of an organic polymer. Organic polymers used favorably for the present invention include, for example, crystalline polyolefins such as polyethylene and polypropylene; amorphous cyclic polyolefins having a cyclic structure; polyesters such as polyethylene terephthalate and polyethylene naphthalate; and various other polymers such as polyamide, polycarbonate, polystyrene, polyvinyl alcohol, saponification products of ethylene vinyl acetate copolymers, polyacrylonitrile, and polyacetal. Of these, an amorphous cyclic polyolefin or polyethylene terephthalate, which have high transparency, versatility, and good mechanical characteristics, is preferably contained. Furthermore, the aforementioned organic polymer may be either a homopolymer or a copolymer, and the organic polymer may be a single polymer or a mixture of a plurality of polymers.

The surface of the polymer base on which an inorganic layer [A] is to be formed may be subjected to pretreatment such as corona treatment, plasma treatment, ultraviolet ray treatment, ion bombardment treatment, solvent treatment, or formation of an undercoat layer composed of organic or inorganic substances or their mixture with the aim of improving the contact with another layer and smoothness. The opposite surface to the one on which the inorganic layer [A] is to be formed may be coated with a coat layer of an organic substance, inorganic substance, or a mixture thereof with the aim of improving the slip properties of the film during the wind-up step.

There are no specific limitations on the thickness of the polymer base to be used for the present invention, but it is preferably 500 μm or less from the viewpoint of maintaining a required flexibility and preferably 5 μm or more from the viewpoint of maintaining a required resistance to tension and impact. To ensure a required film processability and handleability, furthermore, the thickness of the polymer base is still more preferably 10 μm or more and 200 μm or less.

[Inorganic Layer [A]]

The inorganic layer [A] to be used for an at least one embodiment of the present invention may additionally contain an oxide, nitride, or sulfide of aluminum (Al), titanium (Ti), zirconium (Zr), tin (Sn), indium (In), niobium (Nb), molybdenum (Mo), tantalum (Ta), etc., or a mixture thereof, as long as it contains a zinc compound and silicon oxide. For example, in order to ensure high gas barrier properties, the inorganic layer [A] is preferably either an inorganic layer [A1] that includes a coexistence phase of zinc oxide, silicon dioxide, and aluminum oxide or an inorganic layer [A2] that includes a coexistence phase of zinc sulfide and silicon dioxide. The inorganic layer [A1] and the inorganic layer [A2] will be described in detail later.

As a layer that acts to develop gas barrier properties, the inorganic layer [A] used for at least one embodiment of the present invention preferably has a thickness of 10 nm or more and 1,000 nm or less. If the layer has a thickness of less than 10 nm, a sufficiently high degree of gas barrier properties may not be maintained at some positions, possibly leading to uneven gas barrier properties over the plane of the polymer base. If the thickness of the layer is more than 1,000 nm, a large residual stress will take place in the layer, and cracks will be generated easily in the inorganic layer [A] under bending and external impact, possibly leading to deterioration in the gas barrier properties in the course of long-term use. Therefore, the inorganic layer [A] preferably has a thickness of 10 nm or more and 1,000 nm or less, and from the viewpoint of maintaining required flexibility, the thickness is more preferably 100 nm or more and 500 nm or less. The thickness of the inorganic layer [A] can be commonly determined from cross-sectional observations by transmission electron microscopy (TEM).

The inorganic layer [A] used for at least one embodiment of the present invention preferably has a center plane average roughness SRa of 10 nm or less. If SRa is larger than 10 nm, the inorganic layer [A] will have significant surface irregularities and exposed spaces will remain among sputtered grains, possibly leading to rarefactions in film properties and difficulties in realizing improved barrier properties even if the film thickness is increased. If SRa is larger than 10 nm, on the other hand, the silicon compound layer [B] formed on the inorganic layer [A] will fail to have uniform film properties, possibly leading to deterioration in gas barrier properties. Accordingly, the inorganic layer [A] preferably has a SRa of 10 nm or less, more preferably 7 nm or less.

The SRa of the inorganic layer [A] used for embodiments of the present invention can be measured by using a three dimensional surface roughness measuring instrument.

There are no specific limitations on the method to be used for forming the inorganic layer [A] for the present invention, and useful formation methods include, for example, vacuum deposition, sputtering, ion plating, and CVD. Of these methods, sputtering is preferable because a dense inorganic layer [A] can be formed easily.

[Inorganic Layer [A1]]

Described in detail below is the inorganic layer [A1], which includes a coexistence phase of zinc oxide, silicon dioxide, and aluminum oxide and serves favorably as the inorganic layer [A] for an embodiment of the present invention. Hereinafter, the coexistence phase of zinc oxide, silicon dioxide, and aluminum oxide is sometimes referred to simply as $ZnO$—$SiO_2$—$Al_2O_3$. In regard to silicon dioxide ($SiO_2$), a substance having a silicon-oxygen composition ratio slightly differing from the one based on the above composition formula (between SiO and $SiO_2$) may result depending on the production conditions adopted, but hereinafter, all such substances are referred to as silicon dioxide or $SiO_2$. For zinc oxide and aluminum oxide as well, such a difference in the composition ratio from the chemical formula is treated in the same manner, and they are referred to as zinc oxide or ZnO, and aluminum oxide or $Al_2O_3$, respectively, regardless of the small differences in their composition ratios that may occur depending on the production conditions.

In the coexistence phase of zinc oxide, silicon dioxide, and aluminum oxide, the coexistence of a crystalline component contained in the zinc oxide and an amorphous component contained in the silicon dioxide acts to depress the crystal growth of the zinc oxide, which would form crystallites easily, leading to the formation of particles with small diameters and, in turn, a dense layer, which may depress the penetration of water vapor. This is considered to be the reason why the existence of the inorganic layer [A1] serves to allow the gas barrier film according to the present invention to have improved gas barrier properties.

It is also inferred that the coexistence of aluminum oxide acts to prevent the crystal growth more strongly compared with the case of the coexistence of only zinc oxide and silicon dioxide, thereby further increasing the denseness of the layer and accordingly depressing the deterioration in gas barrier properties attributable to the formation of cracks during use.

The composition of the inorganic layer [A1] can be determined by ICP emission spectroscopy analysis as described later. The atom concentration determined by ICP emission spectroscopy analysis is preferably 20 to 40 atom % for the zinc atom, 5 to 20 atom % for the silicon atom, 0.5 to 5 atom % for the aluminum atom, and 35 to 70 atom % for the 0 atom. If the zinc atom concentration is more than 40 atom % or if the silicon atom concentration is less than 5 atom %, there will be a lack of silicon dioxide and/or aluminum oxide that can depress the crystal growth of zinc oxide and accordingly, gaps and defects will increase, possibly making it difficult to develop gas barrier properties adequately. If the zinc atom concentration is less than 20 atom % or if the silicon atom concentration is more than 20 atom %, the amorphous component of, silicon dioxide in the layer will account for an increased proportion, possibly leading to a layer with decreased flexibility. If the aluminum atom concentration is more than 5 atom %, the affinity between zinc oxide and silicon dioxide will be so high that the film will have an increased pencil hardness, possibly leading to the formation of cracks under heat or external stress. If the aluminum atom concentration is less than 0.5 atom %, the affinity between zinc oxide and silicon dioxide will not be sufficiently high, and accordingly, the binding force among the particles forming the layer will not be increased, possibly leading to decreased flexibility. If the oxygen atom concentration is more than 70 atom %, the quantity of defects in the inorganic layer [A1] will increase, possibly leading to a failure in realizing desired gas barrier properties. If the oxygen atom concentration is less than 35 atom %, zinc, silicon, and aluminum will not be in a sufficiently oxidized state, and accordingly, the crystal growth will not be depressed, leading to particles with large diameters and possibly resulting in deterioration in gas barrier properties. In view of these points, the atom concentration is preferably 25 to 35 atom % for the zinc atom, 10 to 15 atom % for the silicon atom, 1 to 3 atom % for the aluminum atom, and 50 to 64 atom % for the oxygen atom.

The inorganic layer [A1] has a composition similar to that of the mixed sintered material used for producing that layer, and accordingly, the composition of the inorganic layer [A1] can be optimized by using a mixed sintered material having a composition suitable for the intended layer.

To determine the composition of the inorganic layer [A1], the quantity of each element of zinc, silicon, and aluminum is measured by ICP emission spectroscopy and the composition ratio of zinc oxide, silicon dioxide, aluminum oxide, and other inorganic oxides contained are calculated. Calculation for the oxygen atom is carried out on the assumption that the zinc atom, silicon atom, and aluminum atom exist in the form of zinc oxide (ZnO), silicon dioxide ($SiO_2$), and aluminum oxide ($Al_2O_3$), respectively. ICP emission spectroscopy analysis can perform simultaneous multi-element examination based on the luminescence emission spectrum observed when a specimen is introduced along with argon gas to a plasma source, and can be applied to composition analysis. If additional layers such as another inorganic layer and resin layer are disposed on the inorganic layer [A1], ICP luminescence spectroscopy analysis may be performed after removing these layers by ion etching or chemical treatment as required.

[Inorganic layer [A2]]

Described in detail next is the inorganic layer [A2], which includes a coexistence phase of zinc sulfide and silicon dioxide and serves favorably as the inorganic layer [A] for the present invention. Hereinafter, the coexistence phase of zinc sulfide and silicon dioxide is occasionally referred to as $ZnS$—$SiO_2$. In regard to silicon dioxide ($SiO_2$), a substance having a composition ratio slightly differing from the one based on the silicon-oxygen ratio in the above composition formula (between SiO and $SiO_2$) may result depending on the production conditions adopted, but all such substances are referred to as silicon dioxide or $SiO_2$. For zinc sulfide as well, such a difference in the composition ratio from the chemical formula is treated in the same manner, and it is referred to as zinc sulfide or ZnS regardless of the differences in the composition ratio that may occur depending on the production conditions.

In the coexistence phase of zinc sulfide and silicon dioxide, the coexistence of a crystalline component contained in the zinc sulfide and an amorphous component contained in the silicon dioxide acts to depress the crystal growth of the zinc sulfide, which otherwise tends to form crystallites easily, leading to the formation of particles with small diameters and, in turn, a dense layer, which would depress the penetration of water vapor. This is considered to be the reason why the existence of the inorganic layer [A2] serves to allow the gas barrier film according to embodiments of the present invention to have improved gas barrier properties.

It is also considered that the coexistence phase of zinc sulfide and silicon dioxide, which contains a zinc sulfide component with a depressed crystal growth rate, is higher in flexibility than a layer composed only of an inorganic oxide or metal oxide and less liable to cracks under heat or external stress, thus allowing the inorganic layer [A2] to serve to depress the deterioration in gas barrier properties that is attributed to the formation of cracks during use.

In regard to the inorganic layer [A2], zinc sulfide accounts for a mole fraction of 0.7 to 0.9 of the total quantity of zinc sulfide and silicon dioxide. If zinc sulfide accounts for a mole fraction of more than 0.9 of the total quantity of zinc sulfide and silicon dioxide, there will be a lack of silicon dioxide that can depress the crystal growth of zinc sulfide and accordingly, gaps and defects will increase, possibly making it difficult to develop required gas barrier properties. If zinc sulfide accounts for a mole fraction of less than 0.7 of the total quantity of zinc sulfide and silicon dioxide, the quantity of the amorphous component of silicon dioxide in the inorganic layer [A2] will increase and the layer will decrease in flexibility, possibly leading to a gas barrier film with decreased flexibility under mechanical bending. It is more preferable for the zinc sulfide to account for a mole fraction of 0.75 to 0.85 of the total quantity of zinc sulfide and silicon dioxide.

The inorganic layer [A2] has a composition similar to that of the mixed sintered material used for producing the layer, and accordingly, the composition of the inorganic layer [A2] can be optimized by using a mixed sintered material having a composition that meets the objective.

Composition analysis of the inorganic layer [A2] can be carried out by first determining the composition ratio of zinc and silicon by ICP emission spectroscopy, and applying the results to quantitative analysis of each element by the Rutherford backscattering technique to determine the contents of zinc sulfide, silicon dioxide, and other inorganic oxides contained. ICP emission spectroscopy analysis can perform simultaneous multi-element examination based on the luminescence emission spectrum observed when a specimen is introduced along with argon gas to a plasma source, and can be applied to composition analysis. Furthermore, the Rutherford backscattering technique can accelerate charged particles at a high voltage, apply them to a specimen, and identify the species and determine the quantities of the elements involved from the number and energy of the charged particles rebounded from the specimen, thereby determining the composition ratio of each element. Here, since the inorganic layer [A2] is a composite layer of a sulfide and oxide, analysis is performed by the Rutherford backscattering technique which can analyze the composition ratios of sulfur and oxygen. If additional layers such as another inorganic layer and resin layer are disposed on the inorganic layer [A2], analysis by ICP luminescence spectroscopy and Rutherford backscattering may be performed after removing these layers by ion etching or chemical treatment as required.

[Silicon Compound Layer [B]]

Next, the silicon compound layer [B] is described in detail below. The silicon compound layer [B] used for at least one embodiment of the present invention contains silicon oxynitride and may also contain an oxide, nitride, organic compound, or a mixture thereof. For example, it may contain other silicon compounds such as $SiO_2$, $Si_3N_4$, and alkoxysilane with the aim of controlling the refractive index, hardness, and contact strength. Here, the composition of the silicon compound layer [B] can be determined by X-ray photoelectron spectroscopy. From the viewpoint of water vapor permeability, the silicon compound layer [B] preferably contains 0.1 to 100 mass % of silicon oxynitride.

For the gas barrier film according to at least one embodiment of the present invention, it is inferred that the use of the silicon compound layer [B] acts to improve the gas barrier properties as described in paragraphs (i) and (ii) below.

(i) First, the contributions of the layer itself are inferred as follows: because of containing silicon oxynitride, the layer is denser than those formed only of $SiO_2$ and accordingly less permeable to oxygen and water vapor to ensure high initial gas barrier properties and in addition, it is higher in flexibility than those formed only of $Si_3N_4$ and less liable to cracking under heat or external stress during use, leading to prevention of deterioration in gas barrier properties attributable to cracking.

(ii) Second, the contributions of stacking the inorganic layer [A] and the silicon compound layer [B] in such a manner that they are in contact with each other are inferred as follows: the silicon oxynitride contained in the silicon compound layer [B] works to fill the defects, such as pinholes and cracks, existing in the inorganic layer [A], thereby developing high barrier properties; the formation of the silicon compound layer [B] in contact with the inorganic layer [A] allows some components, such as zinc oxide, of the inorganic layer [A] to act as catalyst for improving the film properties of the silicon compound layer [B], thereby ensuring further improved gas barrier properties; and in addition, the inorganic layer [A] and the silicon compound layer [B] form chemical bonds to realize a firm contact between the inorganic layer [A] and the silicon compound layer [B], leading to increased flex resistance during use. The interface region between the inorganic layer [A] and the silicon compound layer [B] is described in detail later.

The silicon compound layer [B] used for at least one embodiment of the present invention preferably has a thickness of 50 nm or more and 2,000 nm or less, more preferably 50 nm or more and 1,000 nm or less. If the thickness of the silicon compound layer [B] is less than 50 nm, stable water vapor barrier properties may not be realized in some cases. If the silicon compound layer [B] has a thickness of more than 2,000 nm, the silicon compound layer [B] will possibly suffer a large residual stress that can cause warping of the polymer base and cracking in the silicon compound layer [B] and/or the inorganic layer [A], leading to degraded gas barrier properties. Accordingly, the silicon compound layer [B] preferably has a thickness of 50 nm or more and 2,000 nm or less. The thickness of the silicon compound layer [B] can be determined from cross-sectional images observed by transmission electron microscopy (TEM).

The silicon compound layer [B] used for at least one embodiment of the present invention preferably has a center plane average roughness SRa of 10 nm or less. An SRa of less than 10 nm is preferable because it ensures high repetitive reproducibility of gas barrier properties. If the surface of the silicon compound layer [B] has a SRa of more than 10 nm, cracks due to stress concentration tend to occur easily in regions with many irregularities, possibly leading to a decrease in repetitive reproducibility of gas barrier properties. Accordingly, for the present invention, the silicon compound layer [B] preferably has a SRa of 10 nm or less, more preferably 7 nm or less.

The SRa of the silicon compound layer [B] used for at least one embodiment of the present invention can be measured by using a three dimensional surface roughness measuring instrument.

In the silicon compound layer [B], the oxygen atom preferably has an atomic composition ratio of 0.1 or more and less than 2.0 relative to the silicon atom and the nitrogen atom preferably has an atomic composition ratio of 0.1 or more and less than 1.0 relative to the silicon atom based on element distributions observed by X-ray photoelectron spectroscopy. In the silicon compound layer [B], it is preferable that the oxygen atom have an atomic composition ratio of 0.1 or more and less than 2.0 relative to the silicon atom and that the nitrogen atom have an atomic composition ratio of 0.1 or more and less than 1.0 relative to the silicon atom because in that case, the layer will have high gas barrier properties and high flex resistance. If the oxygen atom has an atomic composition ratio of less than 0.1 relative to the silicon atom or if the nitrogen atom has an atomic composition ratio of 1.0 or more relative to the silicon atom, the silicon compound layer [B] will be too dense to have sufficiently high flexibility and will be liable to cracking under heat or external stress, possibly leading to deterioration in gas barrier properties. If the oxygen atom has an atomic composition ratio of 2.0 or more relative to the silicon atom or if the nitrogen atom has an atomic composition ratio of less than 0.1 relative to the silicon atom, the silicon compound layer [B] will fail to be sufficiently dense and fail to have sufficient gas barrier properties. From such a point of view, it preferably has a region where the oxygen atom has an atomic composition ratio of 0.3 or more and less than 2.0 relative to the silicon atom and the nitrogen atom has an atomic composition ratio of 0.1 or more and less than 0.8 relative to the silicon atom.

Preferred materials to form the silicon compound layer [B] used for at least one embodiment of the present invention include silicon compounds having a polysilazane backbone. Such silicon compounds having a polysilazane backbone include, for example, compounds having a partial structure represented by chemical formula (1) given below. Specifically, useful ones include perhydropolysilazane, organopolysilazane, and derivatives thereof, which may be used singly or as a combination of two or more thereof. For at least one embodiment of the present invention, it is preferable from the viewpoint of realizing improved gas barrier properties to use a perhydropolysilazane as represented by chemical formula (1) given below in which $R_1$, $R_2$, and $R_3$ are all hydrogen atoms, but it may be an organopolysilazane in which some or all of the hydrogen atoms are replaced with organic groups such as alkyl groups. It may be of a single component or of a mixture of two or more components.

[Chemical formula 1]

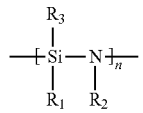
(1)

[Interface Region [I] in Inorganic Layer [A] Facing Silicon Compound Layer [B]]

For at least one embodiment of the present invention, it is preferable for ZnLMM spectral curves taken by X-ray photoelectron spectroscopy from the interface region [I] in the inorganic layer [A] facing to the silicon compound layer [B] (as represented by the thick line in FIG. 4) to be relatively broader than those from the central region of the inorganic layer [A] (as represented by the thin line in FIG. 4). Here, the relative breadth of a ZnLMM spectral curve is determined based on the breadth of the spectral curve at an intensity of 0.4 assuming that the peak intensity is unity. In regard to the broadening of a spectral curve, furthermore, it is preferable for the curve to broaden more largely at low binding energies (the binding energy decreases to the right along the horizontal axis in FIG. 4).

Here, "the interface region [I] in the inorganic layer [A] facing to the silicon compound layer [B]" to be examined based on the ZnLMM spectrum taken by X-ray photoelectron spectroscopy is defined as the region in which the coexistence of nitrogen atoms and zinc atoms is detected as the element distribution is observed by X-ray photoelectron spectroscopy in the depth direction from the surface of the silicon compound layer [B] as shown in FIG. 3, whereas the central region of the inorganic layer [A] is defined as the ±20 nm region centering on the position located at a half of the total depth of the inorganic layer [A] determined as the element distribution is observed by X-ray photoelectron spectroscopy in the depth direction of the inorganic layer [A] from its boundary with the silicon compound layer [B].

A broader spectral curve observed by X-ray photoelectron spectroscopy means the existence of different binding states. Specifically, it suggests that Zn compounds differing in the biding state from ZnO account for a larger proportion in the interface region [I] than in the central region of the inorganic layer [A]. Though not yet clarified in detail, in view of the compositions of the inorganic layer [A] and the silicon compound layer [B] and considering the fact that Zn compounds differing in the binding state from ZnO account for a larger proportion in the interface region [I], it is inferred that interface region [I] results from reactions between the inorganic layer [A] and the silicon compound layer [B] that coexist. Specifically, it is expected that defects such as pinholes and cracks existing in the inorganic layer [A] are filled with, and undergo chemical bonding with, substances coming from the silicon compound layer [B], leading to the development of high barrier properties. In addition, the contact between the inorganic layer [A] and the silicon compound layer [B] is considered to be improved to realize very high flex resistance.

[Undercoat Layer [C]]

To improve the gas barrier properties and increase the flex resistance, it is preferable for the gas barrier film according to at least one embodiment of the present invention to be provided with an undercoat layer [C] containing a structure in the form of a crosslinked product of a polyurethane compound [C1] having an aromatic ring structure and located between the aforementioned polymer base and the inorganic layer [A]. The existence of the undercoat layer [C] according to at least one embodiment of the present invention is preferable because if defects such as protrusions and small scratches exist on the polymer base, the inorganic layer [A] formed on the polymer base may also suffer the generation of pinholes and cracks starting from these defects to deteriorate the gas barrier properties and flex resistance. In the case where there is a large difference in thermal dimensional stability between the polymer base and the inorganic layer [A], gas barrier properties and flex resistance may deteriorate and accordingly, it is preferable to provide the undercoat layer [C] according to the present invention. Furthermore, the undercoat layer [C] used for at least one embodiment of the present invention preferably contains a polyurethane compound [C1] having an aromatic ring structure from the viewpoint of thermal dimensional stability and flex resistance, and more preferably, it also contains an ethylenically unsaturated compound [C2], photopolymerization initiator [C3], organic silicon compound [C4] and/or inorganic silicon compound [C5].

[Polyurethane Compound [C1] Having an Aromatic Ring Structure]

The polyurethane compound [C1] having an aromatic ring structure used for at least one embodiment of the present invention contains an aromatic ring and urethane bond in the backbone chain or in a side chain and can be produced, for example, by polymerizing an epoxy (meth)acrylate having a hydroxyl group and aromatic ring in the molecule (c1), a diol compound (c2), and a diisocyanate compound (c3).

An epoxy (meth)acrylate having a hydroxyl group and aromatic ring in the molecule (c1) can be produced by reacting an (meth)acrylic acid derivative with a diepoxy compound of bisphenol A type, hydrogenated bisphenol A type, bisphenol F type, hydrogenated bisphenol F type, resorcin, hydroquinone, and other aromatic glycols.

Useful examples of the diol compound (c2) include, for example, ethylene glycol, diethylene glycol, polyethylene glycol, propylene glycol, 1,3-propanediol, 1,3-butanediol, 1,4-butanediol, 1,5-pentanediol, 1,6-hexanediol, 1,7-heptanediol, 1,8-octanediol, 1,9-nonanediol, 1,10-decanediol, 2,4-dimethyl-2-ethyl hexane-1,3-diols, neopentyl glycol, 2-ethyl-2-butyl-1,3-propanediol, 3-methyl-1,5-pentanediol, 1,2-cyclohexanedimethanol, 1,4-cyclohexanedimethanol, 2,2,4,4-tetramethyl-1,3-cyclobutanediol, 4,4'-thiodiphenol, bisphenol A, 4,4'-methylene diphenol, 4,4'-(2-norbornylidene) diphenol, 4,4'-dihydroxy biphenol, o-, m-, and p-dihydroxy benzene, 4,4'-isopropylidene phenol, 4,4'-isopropylidene bisdiol, cyclopentane-1,2-diol, cyclohexane-1,2-diol, cyclohexane-1,4-diol, and bisphenol A. These may be used singly or as a mixture of two or more thereof.

Useful examples of the diisocyanate compound (c3) include, for example, aromatic diisocyanates such as 1,3-phenylene diisocyanate, 1,4-phenylene diisocyanate, 2,4-tolylene diisocyanate, 2,6-tolylene diisocyanate, 2,4-diphenyl methane diisocyanate, and 4,4-diphenyl methane diisocyanate; aliphatic diisocyanate compounds such as ethylene diisocyanate, hexamethylene diisocyanate, 2,2,4-trimethyl hexamethylene diisocyanate, 2,4,4-trimethyl hexamethylene diisocyanate, lysine diisocyanate, and lysine triisocyanate; alicyclic isocyanate compounds such as isophorone diisocyanate, dicyclohexyl methane-4,4-diisocyanate, and methyl cyclohexylene diisocyanate; and aralipathic isocyanate compounds such as xylene diisocyanate and tetramethyl xylylene diisocyanate. These may be used singly or as a mixture of two or more thereof.

There are no specific limitations on the component ratio among (c1), (c2), and (c3) as long as an intended weight average molecular weight is realized. The polyurethane compound [C1] having an aromatic ring structure according to at least one embodiment of the present invention preferably has a weight average molecular weight (Mw) of 5,000 to 100,000. A weight average molecular weight (Mw) of 5,000 to 100,000 is preferable because in that case, cured film with high thermal dimensional stability and high flex resistance can be obtained. Here, for the present invention, the weight average molecular weight (Mw) is measured by gel permeation chromatography and converted in terms of standard polystyrene.

[Ethylenically Unsaturated Compound [C2]]

Examples of the ethylenically unsaturated compound [C2] include, for example, di(meth)acrylates such as 1,4-butanediol di(meth)acrylate and 1,6-hexanediol di(meth)acrylate; polyfunctional (meth)acrylates such as pentaerythritol tri(meth)acrylate, pentaerythritol tetra(meth)acrylate, dipenta erythritol tetra(meth)acrylate, dipenta erythritol penta(meth)acrylate, and dipenta erythritol hexa(meth)acrylate; and epoxy acrylates such as bisphenol A type epoxy di(meth)acrylate, bisphenol F type epoxy di(meth)acrylate, and bisphenol S type epoxy di(meth)acrylate. Of these, polyfunctional (meth)acrylate is preferable because of having high thermal dimensional stability and surface protection performance. These may be used singly or as a mixture of two or more thereof.

There are no specific limitations on the content of the ethylenically unsaturated compound [C2], but from the viewpoint of thermal dimensional stability and surface protection performance, its content is preferably in the range of 5 to 90 mass %, more preferably in the range of 10 to 80 mass %, relative to the total, or 100 mass %, of its weight and the weight of the polyurethane compound [C1] having an aromatic ring structure.

[Photopolymerization Initiator [C3]]

There are no specific limitations on the material of the photopolymerization initiator [C3] as long as the gas barrier film according to the present invention can maintain gas barrier properties and flex resistance. Photopolymerization initiators that can be used suitably for the present invention include, for example, alkyl phenon based photopolymerization initiators such as 2,2-dimethoxy-1,2-diphenyl ethane-1-one, 1-hydroxy-cyclohexyl phenyl ketone, 2-hydroxy-2-methyl-1-phenyl-propane-1-one, 1-[4-(2-hydroxyethoxy)-phenyl]-2-hydroxy-2-methyl-1-propane-1-one, 2-hydroxy-1-{4-[4-(2-hydroxy-2-methyl-propionyl)-benzyl]phenyl}-2-methyl-propane-1-one, phenylglyoxylic acid methyl ester, 2-methyl-1-(4-methylthiophenyl)-2-morpholinopropane-1-one, 2-benzyl-2-dimethylamino-1-(4-morpholinophenyl)-butanone-1,2-(dimethylamino)-2-[(4-methyl phenyl) methyl]-1-[4-(4-morpholinyl)phenyl]-1-butanone; acyl phosphine oxide based photopolymerization initiators such as 2,4,6-trimethyl benzoyl-diphenyl-phosphine oxide and bis(2,4,6-trimethyl benzoyl)-phenyl phosphine oxide; titanocene based photopolymerization initiators such as bis(η5-2,4-cyclopentadiene-1-yl)-bis(2,6-difluoro-3-(1H-pyrrole-1-yl)-phenyl) titanium; and photopolymerization initiators having an oxime ester structure such as 1,2-octanedion and 1-[4-(phenyl thio)-, 2-(0-benzoyl oxime)].

From the viewpoint of curing performance and surface protection performance, it is preferable to use, among others, a photopolymerization initiator selected from the group consisting of 1-hydroxy-cyclohexyl phenyl ketone, 2-methyl-1-(4-methyl thiophenyl)-2-morpholinopropane-1-one, 2,4,6-trimethylbenzoyl-diphenyl-phosphine oxide, and bis(2,4,6-trimethyl benzoyl)-phenylphosphine oxide. These may be used singly or as a mixture of two or more thereof.

There are no specific limitations on the content of the photopolymerization initiator [C3], but from the viewpoint of curing performance and surface protection performance, it is preferably in the range of 0.01 to 10 mass %, more preferably in the range of 0.1 to 5 mass %, relative to the total amount, or 100 mass %, of the polymerizable components.

[Organic Silicon Compound [C4]]

Examples of the organic silicon compound [C4], for instance, vinyl trimethoxysilane, vinyl triethoxysilane, 2-(3,4-epoxy cyclohexyl) ethyl trimethoxysilane, 3-glycidoxypropyl methyl dimethoxy silane, 3-glycidoxypropyl trimethoxysilane, 3-glycidoxypropyl methyl diethoxy silane, 3-glycidoxypropyl triethoxysilane, 3-methacryloxypropyl methyl dimethoxy silane, 3-methacryloxypropyl trimethoxysilane, 3-methacryloxypropyl methyl diethoxy silane, 3-methacryloxypropyl triethoxysilane, 3-acryloxypropyl trimethoxysilane, N-2-(aminoethyl)-3-aminopropyl methyl dimethoxy silane, N-2-(aminoethyl)-3-aminopropyl trimethoxysilane, 3-aminopropyl trimethoxysilane, 3-aminopropyl triethoxysilane, and 3-isocyanate propyl triethoxysilane.

From the viewpoint of curing performance and polymerization activity under active energy ray irradiation, it is preferable to use, among others, an organic silicon compound selected from the group consisting of 3-methacryloxypropyl trimethoxysilane, 3-methacryloxypropyl triethoxysilane, vinyl trimethoxysilane, and vinyl triethoxysilane. These may be used singly or as a mixture of two or more thereof.

There are no specific limitations on the content of the organic silicon compound [C4], but from the viewpoint of curing performance and surface protection performance, it is preferably in the range of 0.01 to 10 mass %, more preferably in the range of 0.1 to 5 mass %, relative to the total amount, or 100 mass %, of the polymerizable components.

[Inorganic Silicon Compound [C5]]

From the viewpoint of surface protection performance and transparency, it is preferable for the inorganic silicon compound [C5] to be in the form of silica particles, and such silica particles preferably have a primary particle diameter in the range of 1 to 300 nm, more preferably in the range of 5 to 80 nm. The primary particle diameter referred to herein is defined as the particle diameter d calculated by Equation (1) given below where s represents the specific surface area measured by gas adsorption.

[Formula 1]

$$d = 6/\rho s \qquad (1)$$

ρ: density

[Thickness of Undercoat Layer [C]]

The undercoat layer [C] preferably has a thickness of 200 nm or more and 4,000 nm or less. If the thickness of the undercoat layer [C] is less than 200 nm, it may be sometimes impossible to depress the adverse influence of defects such as protrusions and small scratches existing on the polymer base. If the thickness of the undercoat layer [C] is more than 4,000 nm, the undercoat layer [C] may lose smoothness and the inorganic layer [A] formed on the undercoat layer [C] may have a surface with large-size irregularities to allow gaps to be left among the sputtered particles formed thereon, making it difficult to develop dense film properties and improved gas barrier properties. Accordingly, the undercoat layer [C] preferably has a thickness of 200 nm or more and 4,000 nm or less. The thickness of the silicon compound layer [B] can be determined from cross-sectional images observed by transmission electron microscopy (TEM).

The undercoat layer [C] preferably has a center plane average roughness SRa of 10 nm or less. A SRa of 10 nm or less is preferable because it facilitates the formation of a uniform inorganic layer [A] on the undercoat layer [C] and ensures high repetitive reproducibility of gas barrier properties. If the surface of the undercoat layer [C] has a SRa of more than 10 nm, the inorganic layer [A] on the undercoat layer [C] may have large-size surface irregularities to allow gaps to be left among the sputtered particles formed thereon, making it difficult to develop dense film properties and improved gas barrier properties. Furthermore, cracks due to stress concentration tend to occur easily in regions with many irregularities, possibly leading to a decrease in repetitive reproducibility of gas barrier properties. Accordingly, for the present invention, the undercoat layer [C] preferably has a SRa of 10 nm or less, more preferably 7 nm or less.

The SRa of the undercoat layer [C] used for at least one embodiment of the present invention can be measured by using a three dimensional surface roughness measuring instrument.

[Other Layers]

The outermost face of the gas barrier film according to at least one embodiment of the present invention may be provided with a hard coat layer designed to improve the abrasion resistant or may be laminated with a film of an organic polymer compound to form a laminate structure unless they cause a deterioration in gas barrier properties. For a structure produced by stacking the inorganic layer [A] and the silicon compound layer [B] in this order and in contact with each other on a polymer base, the outermost face mentioned above refers to that surface of the silicon compound layer [B] which is not in contact with the inorganic layer [A].

[Production Methods for Gas Barrier Film]

Described in detail below are production methods for the gas barrier film according to at least one embodiment of the present invention.

The gas barrier film according to at least one embodiment of the present invention is produced through a process including a step, referred to as step a, for forming an inorganic layer [A] containing a zinc compound and silicon oxide on a polymer base by sputtering and a step, referred to as step b, for forming a silicon compound layer [B] containing silicon oxynitride on the inorganic layer [A] by spreading a coating liquid containing a silicon compound having a polysilazane backbone, then drying it to form a coat film, and subsequently applying an active energy ray to the coat film in a nitrogen atmosphere.

The gas barrier film according to at least one embodiment of the present invention can also be produced through a process including a step, referred to as step c, for forming an undercoat layer [C] on a polymer base by spreading a coating liquid containing a polyurethane compound [C1] having an aromatic ring structure, then drying it to form a coat film, and subsequently applying an active energy ray to the coat film in a nitrogen atmosphere, step a for forming an inorganic layer [A] containing a zinc compound and silicon oxide on the undercoat layer [C] by sputtering, and step b for forming a silicon compound layer [B] containing silicon oxide and silicon oxynitride on the inorganic layer [A] by spreading a coating liquid containing a silicon compound having a polysilazane backbone, then drying it to form a coat film, and subsequently applying an active energy ray to the coat film in a nitrogen atmosphere.

[Step a]

For step a, it is preferable to use a take-up type sputtering apparatus having a structure shown in FIG. 2 because a dense inorganic layer can be formed easily. The inorganic layer [A] has a composition similar to that of the mixed sintered material used for producing that layer, and accordingly, its composition can be optimized by using a mixed sintered material having a composition suitable for the intended layer.

For example, in the case where the inorganic layer [A1] is to be formed, it will be appropriate to use a take-up type sputtering apparatus provided with a sputtering electrode incorporating a sputtering target produced by sintering zinc oxide, silicon dioxide, and aluminum oxide. Here, it is preferable to use a sputtering target produced by sintering zinc oxide, silicon dioxide, and aluminum oxide mixed at a composition ratio by mass of 77/20/3. In the take-up chamber of the take-up type sputtering apparatus having such a sputtering target, the polymer base is attached to the unwinding roller so that the face provided with the inorganic layer [A1] faces the sputtering electrode, and the product is sent on the unwinding roller and guide rollers to reach a cooling drum. Argon gas and oxygen gas, with an oxygen gas having a partial pressure of 10%, are introduced so that the decompression degree will be $2\times10^{-1}$ Pa, and a power of 4,000 W is applied from a direct current power source to generate argon-oxygen gas plasma. Thus, an inorganic layer [A1] is produced by sputtering on the surface of the polymer base. The thickness is controlled by changing the film conveyance speed to ensure a desired thickness. Subsequently, the film is wound up on a take-up roller after travelling on guide rollers.

For example, in the case where the inorganic layer [A2] is to be formed, it will be appropriate to use a take-up type sputtering apparatus provided with a sputtering electrode incorporating a sputtering target produced by sintering zinc sulfide and silicon dioxide. Here, it is preferable to use a sputtering target produced by sintering zinc sulfide and silicon dioxide mixed at a composition ratio by mole of 80/20. In the take-up chamber of the take-up type sputtering apparatus having such a sputtering target, the polymer base is attached to the unwinding roller so that the face provided with the inorganic layer [A2] faces the sputtering electrode, and the film is sent on the unwinding roller and guide rollers to reach a cooling drum. Argon gas is introduced so that the decomposition degree will be $2\times10^{-1}$ Pa, and a power of 500 W is applied from a high frequency power source to generate argon plasma. Thus, an inorganic layer [A2] is produced by sputtering on the surface of the polymer base. The thickness is controlled by changing the film conveyance speed to ensure an intended thickness. Subsequently, the film is wound up on a take-up roller after travelling on guide rollers.

Here, to produce a gas barrier film having an undercoat layer [C] between the polymer base and the inorganic layer [A], it will be appropriate to form the undercoat layer [C] on the polymer base before carrying out the step a, followed by forming the inorganic layer [A] on the undercoat layer [C] by performing sputtering in the same way as above. The method for forming the undercoat layer [C] will be described later in a section addressing the step c.

[Step b]

For step b, a paint containing a silicon compound having a polysilazane backbone is prepared in such a way that it has an appropriate solid content to ensure a desired thickness after drying and then it is spread on the inorganic layer [A] by, for example, reverse coating, gravure coating, rod coating, bar coating, die coating, spray coating, or spin coating. Here, useful examples of the silicon compound having a polysilazane backbone include perhydropolysilazane, organopolysilazane, and derivatives thereof, which may be used singly or as a combination of two or more selected therefrom.

For the present invention, furthermore, the paint containing a silicon compound having a polysilazane backbone is preferably diluted with an organic solvent from the viewpoint of coatability. Specific examples include hydrocarbon based solvents such as xylene, toluene, methyl cyclohexane, pentane, and hexane, and ether based solvents such as dibutyl ether, ethyl butyl ether, and tetrahydrofuran, which are preferably diluted to a solid content of less than 10 mass % before use. These solvents may be used singly or as a mixture of two or more thereof.

The paint containing a silicon compound used to form the silicon compound layer [B] may contain various additives as required unless intended effects of the silicon compound layer [B] are impaired. Useful examples may include catalyst, antioxidant, photostabilizer, ultraviolet absorber, other stabilizers, surface active agent, leveling agent, and antistatic agent.

Subsequently, it is preferable to remove the diluent solvent by drying the coat film after coating. There are no specific limitations on the heat source to be used for the drying and an appropriate heat source such as steam heater, electric heater, and infrared ray heater may be selected arbitrarily. To ensure high gas barrier properties, however, it is preferable to perform the heating at a temperature of 50° C. to 150° C. The heat treatment preferably lasts for several seconds to one hour. During the heat treatment, the temperature may be constant or the temperature may be changed slowly. For the drying treatment, furthermore, the relative humidity may be controlled in the range of 20% RH to 90% RH while performing heat treatment. The heat treatment may be performed in the air or in an inert gas atmosphere.

Then, the coat film containing a silicon compound having a polysilazane backbone obtained after the drying is subjected to active energy ray irradiation treatment such as plasma treatment, ultraviolet ray irradiation treatment, and flash pulse treatment in order to modify the composition of the coat film into a dense layer formed of silicon oxynitride, that is, the silicon compound layer [B] for at least one embodiment of the present invention.

The composition of the silicon compound layer [B], which is determined by X-ray photoelectron spectroscopy, can be controlled by changing the light irradiation quantity and it is controlled so that the film will have a region where the oxygen atom preferably has an atomic composition ratio of 0.1 or more and less than 2.0 relative to the silicon atom and the nitrogen atom preferably has an atomic composition ratio of 0.1 or more and less than 1.0 relative to the silicon atom.

For the active energy ray irradiation treatment in the step b, it is preferable to perform ultraviolet ray treatment because it is simple and highly productive and serves for easy production of a silicon compound layer [B] with a uniform composition. The ultraviolet ray treatment may be performed either under atmospheric pressure or under reduced pressure, but for the present invention, it is preferable to perform the ultraviolet ray treatment under atmospheric pressure from the viewpoint of general versatility and production efficiency. In regard to the oxygen concentration adopted for the ultraviolet ray treatment, the partial pressure of oxygen gas is preferably 1.0% or less, more preferably 0.5% or less, from the viewpoint of composition control of the silicon compound layer [B]. The relative humidity may be set to an arbitrary value. For the ultraviolet ray treatment, furthermore, it is preferable to reduce the oxygen concentration using nitrogen gas.

As the ultraviolet ray generation source, a known device such as high pressure mercury lamp, metal halide lamp, microwave type electrodeless lamp, low pressure mercury lamp, and xenon lamp may be used.

The cumulative light quantity of the ultraviolet ray irradiation is preferably 0.5 to 10 $J/cm^2$, more preferably 0.8 to 7 $J/cm^2$. A cumulative light quantity of 0.5 $J/cm^2$ or more is preferable because a silicon compound layer [B] with a desired composition can be obtained. A cumulative light quantity of 10 $J/cm^2$ or less is preferable because damage to the polymer base and the inorganic layer [B] can be reduced.

For the ultraviolet ray treatment for at least one embodiment of the present invention, the coat film containing a silicon compound having a polysilazane backbone, which is obtained after drying, is preferably heated during the ultraviolet ray treatment in order to improve the production efficiency. The heating temperature is preferably 50° C. to 150° C., more preferably 80° C. to 130° C. A heating temperature of 50° C. or more is preferable because a high production efficiency can be obtained and a heating temperature of 150° C. or less is preferable because deformation and deterioration of other members such as polymer base can be depressed.

[Step c]

For at least one embodiment of the present invention, an undercoat layer [C] may be provided as required by carrying out step c. For step c, a paint containing a polyurethane compound [C1] having an aromatic ring structure is prepared in such a way that it has an appropriate solid content to ensure a desired thickness after drying and then it is spread on the polymer base by, for example, reverse coating, gravure coating, rod coating, bar coating, die coating, spray coating, or spin coating. For the present invention, furthermore, the paint containing a polyurethane compound [C1] having an aromatic ring structure is preferably diluted with an organic solvent from the viewpoint of coatability. Specific examples include hydrocarbon based solvents such as xylene, toluene, methyl cyclohexane, pentane, and hexane, and ether based solvents such as dibutyl ether, ethyl butyl ether, and tetrahydrofuran, which are preferably diluted to a solid content of less than 10 mass % before use. These solvents may be used singly or as a mixture of two or more thereof. In addition, the paint used to form the undercoat layer [C] may contain various additives as required. Useful examples may include catalyst, antioxidant, photostabilizer, ultraviolet absorber, other stabilizers, surface active agent, leveling agent, and antistatic agent.

Subsequently, it is preferable to remove the diluent solvent by drying the coat film after coating. There are no specific limitations on the heat source to be used for the drying and an appropriate heat source such as steam heater, electric heater, and infrared ray heater may be selected arbitrarily. To ensure high gas barrier properties, however, it is preferable to perform the heating at a temperature of 50° C. to 150° C. The heat treatment preferably lasts for several seconds to one hour. During the heat treatment, the temperature may be constant or the temperature may be changed slowly. For the drying treatment, furthermore, the relative humidity may be controlled in the range of 20% RH to 90% RH while performing heat treatment. The heat treatment may be performed in the air or in an inert gas atmosphere.

Then, the coat film containing a polyurethane compound [C1] having an aromatic ring structure, which is obtained after drying, is subjected to active energy ray irradiation treatment to cause crosslinking in the coat film, thereby providing an undercoat layer [C].

There are no specific limitations on the active energy ray to be used for this treatment as long as the undercoat layer [C] can be cured, but it is preferable to adopt ultraviolet ray treatment from the viewpoint of general versatility and efficiency. As the ultraviolet ray generation source, a known device such as high pressure mercury lamp, metal halide lamp, microwave type electrodeless lamp, low pressure mercury lamp, and xenon lamp may be used. In addition, the active energy ray is preferably applied in an atmosphere of inert gas such as nitrogen and argon from the viewpoint of curing efficiency. The ultraviolet ray treatment may be performed either under atmospheric pressure or under reduced pressure, but for the present invention, it is preferable to perform the ultraviolet ray treatment under atmospheric pressure from the viewpoint of general versatility and production efficiency. In regard to the oxygen concentration adopted for the ultraviolet ray treatment, the partial pressure of oxygen gas is preferably 1.0% or less, more preferably 0.5% or less, from the viewpoint of the control of the degree of crosslinking in the undercoat layer [C]. The relative humidity may be set to an arbitrary value.

As the ultraviolet ray generation source, a known device such as high pressure mercury lamp, metal halide lamp, microwave type electrodeless lamp, low pressure mercury lamp, and xenon lamp may be used.

The cumulative light quantity of the ultraviolet ray irradiation is preferably 0.1 to 1.0 $J/cm^2$, more preferably 0.2 to 0.6 $J/cm^2$. A cumulative light quantity of 0.1 $J/cm^2$ or more is preferable because a desired degree of crosslinking in the undercoat layer [C] can be obtained. A cumulative light quantity of 1.0 $J/cm^2$ or less is preferable because damage to the polymer base can be reduced.

[Electronic Devices]

The electronic devices according to the present invention contain the gas barrier film according to at least one embodiment of the present invention and therefore, the electronic devices according to the present invention have excellent gas barrier properties to prevent performance deterioration of the devices due to water vapor etc.

EXAMPLES

The invention is described specifically below with reference to Examples. It should be noted that the present invention should not be construed as limited to the examples given below.

Evaluation Methods

First, the evaluation methods used in Examples and Comparative examples are described. Unless otherwise specified, five specimens were subjected to evaluation test (that is, the number of specimen n was 5) and the average of the measurements of the five specimens were adopted as test result.

(1) Thickness of Layer

Specimens for cross-sectional observation were prepared by the FIB technique using Microsampling System (FB-2000A, manufactured by Hitachi, Ltd.) (specifically, according to the procedure described in "Kobunshi Hyomen Koko" (Polymer Surface Processing), Satoru Iwamori, pp. 118-119). A cross section of a specimen was observed by a transmission electron microscope (H-9000UHRII, manufactured by Hitachi, Ltd.) at an accelerating voltage of 300 kV to measure the thickness of the inorganic layer [A], silicon compound layer [B], and undercoat layer [C].

(2) Center Plane Average Roughness SRa

The surface of each layer was examined under the following conditions using a three dimensional surface roughness measuring instrument (manufactured by Kosaka Laboratory Ltd.).

Apparatus: i-Face model TDA31 three dimensional surface roughness analyze system X axis measuring length/pitch: 500 μm/1.0 μm Y axis measuring length/pitch: 400 μm/5.0 μm Measuring speed: 0.1 mm/s Measuring environment: atmosphere with temperature of 23° C. and relative humidity of 65% RH (3) Water Vapor Permeability ($g/(m^2 \cdot d)$)

The water vapor permeability in an atmosphere with a temperature of 40° C. and relative humidity of 90% RH was measured by the calcium corrosion testing method described in Japanese Patent No. 4407466. Two specimens were subjected to water vapor permeability test and five measurements were taken for each specimen, followed by averaging the 10 measurements obtained to represent the water vapor permeability ($g/(m^2 \cdot d)$).

(4) Composition of Inorganic Layer [A1]

The composition of the layer [A1] was analyzed by ICP emission spectroscopy (SPS4000, manufactured by SII NanoTechnology Inc.). Immediately after the step of forming the inorganic layer [A1] on a polymer base (before forming a silicon compound layer [B] thereon), a specimen was sampled and thermally decomposed with nitric acid and sulfuric acid and thermally dissolved in dilute nitric acid, followed by filtration. The insoluble components were ashed by heating, melted with sodium carbonate, dissolved in dilute nitric acid, and combined with part of the filtrate to a specified volume. The contents of the zinc atom, silicon atom, and aluminum atom in this solution were measured, and converted to the ratio by the number of atoms. Calculation for the oxygen atom was carried out on the assumption that the zinc atom, silicon atom, and aluminum atom exist in the form of zinc oxide (ZnO), silicon dioxide ($SiO_2$), and aluminum oxide ($Al_2O_3$), respectively.

(5) Composition of Inorganic Layer [A2]

The composition of the inorganic layer [A2] was analyzed by ICP emission spectroscopy (SPS4000, manufactured by SII NanoTechnology Inc.). Immediately after the step of forming the inorganic layer [A2] on a polymer base (before forming a silicon compound layer [B] thereon), a specimen was sampled and thermally decomposed with nitric acid and sulfuric acid and thermally dissolved in dilute nitric acid, followed by filtration. The insoluble components were ashed by heating, melted with sodium carbonate, dissolved in dilute nitric acid, and combined with part of the filtrate to a specified volume. The contents of the zinc atom and silicon atom in this solution were measured. Then, the results obtained were applied to the Rutherford backscattering technique (AN-2500, manufactured by Nissin High Voltage Co., Ltd.) for quantitative analysis of the zinc atom, silicon atom, sulfur atom, and oxygen atom to determine the composition ratios of zinc sulfide and silicon dioxide.

(6) Composition of Silicon Compound Layer [B] and Identification of Interface Region [I]

Depth-directional composition analysis of carbon, nitrogen, oxygen, aluminum, silicon, and zinc was carried out by X-ray photoelectron spectroscopy (XPS) to provide element distribution data as illustrated in FIG. 3. The atomic composition ratio of the oxygen atom to the silicon atom and the atomic composition ratio of the nitrogen atom to the silicon atom at different depths were calculated to determine the maximum and minimum. In performing the composition ratio calculations, examination was also carried out to check for an interface region [I]. The measuring conditions used were as described below.
Equipment: Quantera SXM (manufactured by PHI)
Excited X ray: monochromatic Al Kα1,2 irradiation (1486.6 eV)
X-ray diameter: 100 μm
Escape angle of photoelectrons (inclination of detector from specimen surface): 45°
Ion etching: Ar$^+$ ion 2 kV
Raster size: 2×2 mm (7) Flex Resistance Two 100 mm×140 mm specimens were taken from each of the gas barrier films prepared under different conditions. As illustrated in FIG. 5, a metal cylinder with a diameter of 5 mm was fixed to the central region of the specimen surface opposite to that provided with the inorganic layer [A] and the silicon compound layer [B] and the specimen was bent 100 times along the metal cylinder through a range from the position where the subtended angle was 0° (the specimen was flat) to the position where the subtended angle was 180° (the specimen was folded along the cylinder), followed by carrying out water vapor permeability evaluation according to the procedure described in section (3). Five measurements were taken from each specimen and the average of the 10 measurements obtained was calculated to represent the water vapor permeability after flex resistance test.

Procedure for Forming the Inorganic Layer [A] in Examples 1 to 15

(Formation of Inorganic Layer [A1])

Using a take-up type sputtering apparatus having a structure as illustrated in FIG. 2, a sputtering target, which is a mixed sintered material formed of zinc oxide, silicon dioxide, and aluminum oxide, was sputtered on one surface of a polymer base to produce an inorganic layer [A1].

Concrete operations were as described below. First, in the take-up chamber of a take-up type sputtering apparatus containing a sputtering electrode carrying a sputtering target composed of zinc oxide, silicon dioxide, and aluminum oxide sintered at a mass composition ratio of 77:20:3, the polymer base was set on an unwinding roller in such a manner that the surface to be provided with an inorganic layer [A1] faced the sputtering electrode and that the film was allowed to travel on the unwinding roller and guide rollers before reaching a cooling drum. Argon gas and oxygen gas, with an oxygen gas having a partial pressure of 10%, were introduced in such a manner that the decompression degree would be 2×10$^{-1}$ Pa, and a power of 4,000 W was applied from a direct current power source to generate argon-oxygen gas plasma. Thus, an inorganic layer [A1] was produced by sputtering on the surface of the polymer base. The thickness was adjusted by controlling the film conveyance speed. Subsequently, the film was wound up on a take-up roller after travelling on guide rollers.

(Formation of Inorganic Layer [A2])

Using a take-up type sputtering apparatus having a structure as illustrated in FIG. 2, a sputtering target, which is a mixed sintered material formed of zinc sulfide and silicon dioxide, was sputtered on one surface of a polymer base to produce an inorganic layer [A2].

Concrete operations were as described below. First, in the take-up chamber of a take-up type sputtering apparatus containing a sputtering electrode carrying a sputtering target composed of zinc sulfide and silicon dioxide sintered at a molar composition ratio of 80:20, the polymer base was set on an unwinding roller in such a manner that the film would travel on the unwinding roller and guide rollers before reaching a cooling drum. Argon gas was introduced so that the decomposition degree will be 2×10$^{-1}$ Pa, and a power of 500 W is applied from a high frequency power source to generate argon gas plasma. Thus, an inorganic layer [A2] was produced by sputtering on the surface of the polymer base. The thickness was adjusted by controlling the film conveyance speed. Subsequently, the film was wound up on a take-up roller after travelling on guide rollers.

(Example of Synthesis of Polyurethane Compound [C1] Having Aromatic Ring Structure)

A five-liter four-necked flask containing 300 parts by mass of an acrylic acid adduct of bisphenol A diglycidyl ether (trade name—epoxy ester 3000A, manufactured by Kyoeisha Chemical Co., Ltd.) and 710 parts by mass of ethyl acetate was heated to an internal temperature of 60° C. Then, after adding 0.2 part by mass of di-n-butyl tin dilaurate as synthesize catalyst, 200 parts by mass of dicyclohexyl methane 4,4'-diisocyanate (manufactured by Tokyo Chemical Industry Co., Ltd.) was added by dropping it for one hour. The reaction was continued for 2 hours after the completion of the dropping and then 25 parts by mass of diethylene glycol (manufactured by Wako Pure Chemical Industries, Ltd.) was added by dropping it for one hour. The reaction was continued for 5 hours after the completion of the dropping to provide a polyurethane compound having an aromatic ring structure with a weight average molecular weight of 20,000.

Example 1

Polyethylene terephthalate film (Lumirror (registered trademark) U48, manufactured by Toray Industries, Inc.) with a thickness of 50 μm was used as polymer base, and an inorganic layer [A1] with a thickness of 180 nm was formed on one side of this polymer base. In regard to the composition of the inorganic layer [A1], the atom concentration was 27.5 atom % for the Zn atom, 13.1 atom % for the Si atom, 2.3 atom % for the Al atom, and 57.1 atom % for the O atom. A 100 mm length×100 mm width test piece was cut out of the film provided with the inorganic layer [A1] and the center plane average roughness SRa of the inorganic layer [A1] was evaluated. Results are given in Table 1.

Subsequently, 100 parts by mass of a coating material containing perhydropolysilazane (primary component) and a palladium based catalyst (NL120-20, manufactured by AZ Electronic Materials plc, solid content 20 parts by mass) was diluted with 300 parts by mass of dibutyl ether to prepare a coating liquid, which is referred to as coating liquid 1, to be used for forming a silicon compound layer [B] and coating liquid 1 was spread on the inorganic layer [A1] with a Micro Gravure Coater (gravure line number 200UR, gravure rotation ratio 100%) and dried at 120° C. for 1 minute. After the drying, ultraviolet ray treatment was carried out under the following conditions to form a silicon compound layer [B] with a thickness of 120 nm, thereby providing a gas barrier film.
Ultraviolet ray treatment equipment: MEIRH-M-1-152-H (M. D. Excimer, Inc.)
Introduced gas: N$_2$
Cumulative light quantity: 3,000 mJ/cm$^2$
Specimen temperature control: 100° C.

The resulting gas barrier film was subjected to composition analysis by X-ray photoelectron spectroscopy (XPS) to determine element distributions in the depth direction. The atomic composition ratio of the oxygen atom to the silicon atom and the atomic composition ratio of the nitrogen atom to the silicon atom at different depths were calculated to determine the maximum (max) and minimum (min) as shown in Table 1.

A 100 mm length×140 mm width test piece was cut out of the resulting gas barrier film and subjected to water vapor permeability evaluation. Results are given in Table 1.

Example 2

Polyethylene terephthalate film (Lumirror (registered trademark) U48, manufactured by Toray Industries, Inc.) with a thickness of 50 µm was used as polymer base. Then, 150 parts by mass of the polyurethane compound, 20 parts by mass of dipentaerythritol hexaacrylate (Light Acrylate DPE-6A (trade name), manufactured by Kyoeisha Chemical Co., Ltd.), 5 parts by mass of 1-hydroxy-cyclohexyl phenyl-ketone (Irgacure 184 (trade name), manufactured by BASF Japan), 3 parts by mass of 3-methacryloxypropyl methyl diethoxy silane (KBM-503 (trade name), manufactured by Shin-Etsu Silicones), 170 parts by mass of ethyl acetate, 350 parts by mass of toluene, and 170 parts by mass of cyclohexanone were mixed to prepare a coating liquid, which is referred to as coating liquid 2, to be used for forming a undercoat layer [C]. Subsequently, coating liquid 2 was spread on a polymer base with a Micro Gravure Coater (gravure line number 150UR, gravure rotation ratio 100%) and dried at 100° C. for 1 minute. After the drying, ultraviolet ray treatment was carried out under the following conditions to form an undercoat layer [C] with a thickness of 1,000 nm.

Ultraviolet ray treatment equipment: LH10-10Q-G (Fusion UV Systems Japan K.K.)
Introduced gas: $N_2$ (nitrogen inert box)
Ultraviolet ray source: microwave type electrodeless lamp
Cumulative light quantity: 400 mJ/cm$^2$
Specimen temperature: room temperature Then, an inorganic layer [A1] with a thickness of 180 nm was formed on the undercoat layer [C]. In regard to the composition of the inorganic layer [A1], the atom concentration was 27.5 atom % for the Zn atom, 13.1 atom % for the Si atom, 2.3 atom % for the Al atom, and 57.1 atom % for the O atom. A 100 mm length×100 mm width test piece was cut out of the film provided with the inorganic layer [A1] and the center plane average roughness SRa of the inorganic layer [A1] was evaluated. Results are given in Table 1.

In addition, 100 parts by mass of a coating material containing perhydropolysilazane (primary component) and a palladium based catalyst (NL120-20, manufactured by AZ Electronic Materials plc, solid content 20 parts by mass) was diluted with 300 parts by mass of dibutyl ether to prepare a coating liquid, which is referred to as coating liquid 1, to be used for forming a silicon compound layer [B]. Subsequently, coating liquid 1 was spread on the inorganic layer [A1] with a Micro Gravure Coater (gravure line number 200UR, gravure rotation ratio 100%) and dried at 120° C. for 1 minute. After the drying, ultraviolet ray treatment was carried out under the following conditions to form a silicon compound layer [B] with a thickness of 120 nm, thereby providing a gas barrier film.

Ultraviolet ray treatment equipment: MEIRH-M-1-152-H (M. D. Excimer, Inc.)
Introduced gas: $N_2$
Ultraviolet ray source: excimer lamp (172 nm)
Cumulative light quantity: 3,000 mJ/cm$^2$
Specimen temperature control: 100° C.

A 100 mm length×140 mm width test piece was cut out of the resulting gas barrier film and subjected to water vapor permeability evaluation. Results are given in Table 1.

Example 3

Except for using an amorphous cyclic polyolefin film (Zeonor Film ZF14, manufactured by Zeon Corporation) with a thickness of 100 µm as the polymer base, the same procedure as in Example 1 was carried out to produce a gas barrier film.

Example 4

Except for using an amorphous cyclic polyolefin film (Zeonor Film ZF14, manufactured by Zeon Corporation) with a thickness of 100 µm as the polymer base, the same procedure as in Example 2 was carried out to produce a gas barrier film.

Example 5

Except for forming an inorganic layer [A1] with a thickness of 950 nm, the same procedure as in Example 2 was carried out to provide a gas barrier film.

Example 6

Except for forming an inorganic layer [A2] with a thickness of 150 nm instead of the inorganic layer [A1], the same procedure as in Example 2 was carried out to provide a gas barrier film.

Example 7

Except for forming a silicon compound layer [B] with a thickness of 50 nm, the same procedure as in Example 2 was carried out to provide a gas barrier film.

Example 8

Except for forming a silicon compound layer [B] with a thickness of 1,000 nm, the same procedure as in Example 2 was carried out to provide a gas barrier film.

Example 9

Except for spreading a paint for forming a silicon compound layer [B], drying it, and then treating it in a nitrogen atmosphere at 80° C. for 3 days instead of performing ultraviolet ray treatment, the same procedure as in Example 2 was carried out to produce a gas barrier film.

Example 10

Here, 100 parts by mass of a coating material containing perhydropolysilazane (primary component) and an amine based catalyst (NAX120-20, manufactured by AZ Electronic Materials plc, solid content 20 parts by mass) was diluted with 300 parts by mass of dibutyl ether to prepare a coating liquid for forming a silicon compound layer [B], and except for using this, the same procedure as in Example 2 was carried out to produce a gas barrier film.

Example 11

Here, 100 parts by mass of a coating material containing perhydropolysilazane (primary component) and free of catalysts (NN120-20, manufactured by AZ Electronic Materials plc, solid content 20 parts by mass) was diluted with 300 parts by mass of dibutyl ether to prepare a coating liquid for forming a silicon compound layer [B], and except for using this, the same procedure as in Example 2 was carried out to produce a gas barrier film.

Comparative Example 1

Except for omitting the formation of the inorganic layer [A] on the polymer base and forming a silicon compound layer [B] with a thickness of 120 nm directly on the surface of the polymer base, the same procedure as in Example 1 was carried out to provide a gas barrier film.

Comparative Example 2

Except for omitting the formation of the inorganic layer [B] on the inorganic layer [A], the same procedure as in Example 1 was carried out to provide a gas barrier film.

Comparative Example 3

Except for reversing the step of forming the inorganic layer [A] and the step of forming the silicon compound layer [B], the same procedure as in Example 1 was carried out to produce gas barrier film having a different layer structure.

TABLE 1

| | | undercoat layer [C] | | inorganic layer [A] | | | interface | silicon compound layer [B] | |
|---|---|---|---|---|---|---|---|---|---|
| | polymer base | thickness (nm) | SRa (nm) | material | thickness (nm) | SRa (nm) | region [I] existing | material | O/Si ratio (min/max) |
| Example 1 | PET* | | | A1 | 180 | 6.8 | yes | perhydropolysilazane (containing palladium based catalyst) | 0.54/1.85 |
| Example 2 | PET* | 1000 | 1.5 | A1 | 180 | 1.0 | yes | perhydropolysilazane (containing palladium based catalyst) | 0.52/1.87 |
| Example 3 | COP** | | | A1 | 180 | 1.5 | yes | perhydropolysilazane (containing palladium based catalyst) | 0.54/1.88 |
| Example 4 | COP** | 1000 | 1.1 | A1 | 180 | 0.8 | yes | perhydropolysilazane (containing palladium based catalyst) | 0.53/1.91 |
| Example 5 | PET* | 1000 | 1.5 | A1 | 950 | 0.7 | yes | perhydropolysilazane (containing palladium based catalyst) | 0.50/1.88 |
| Example 6 | PET* | 1000 | 1.5 | A2 | 150 | 1.6 | yes | perhydropolysilazane (containing palladium based catalyst) | 0.55/1.85 |
| Example 7 | PET* | 1000 | 1.5 | A1 | 180 | 1.0 | yes | perhydropolysilazane (containing palladium based catalyst) | 0.54/1.84 |
| Example 8 | PET* | 1000 | 1.5 | A1 | 180 | 1.0 | yes | perhydropolysilazane (containing palladium based catalyst) | 0.55/1.92 |
| Example 9 | PET* | 1000 | 1.5 | A1 | 180 | 1.0 | yes | perhydropolysilazane (containing palladium based catalyst) | 1.83/1.90 |
| Example 10 | PET* | 1000 | 1.5 | A1 | 180 | 1.0 | yes | perhydropolysilazane (containing amine based catalyst) | 0.55/1.93 |
| Example 11 | PET* | 1000 | 1.5 | A1 | 180 | 1.0 | yes | perhydropolysilazane (nocatalyst) | 0.42/1.85 |
| Comparative example 1 | PET* | | | | | | no | perhydropolysilazane (containing palladium based catalyst) | 1.07/1.63 |
| Comparative example 2 | PET* | | | A1 | 180 | 6.8 | no | | |
| Comparative example 3 | PET* | | | A1 | 180 | 3.6 | no | perhydropolysilazane (containing palladium based catalyst) | 1.07/1.63 |

| | silicon compound layer [B] | | | water vapor permeability (g/(m² · d)) | |
|---|---|---|---|---|---|
| | N/Si ratio (min/max) | thickness (nm) | SRa (nm) | initial value | after flex resistance test |
| Example 1 | 0.14/0.59 | 120 | 3.2 | $3.2 \times 10^{-5}$ | $6.3 \times 10^{-5}$ |
| Example 2 | 0.15/0.58 | 120 | 0.8 | $7.5 \times 10^{-6}$ | $9.1 \times 10^{-6}$ |
| Example 3 | 0.16/0.59 | 120 | 1.2 | $6.5 \times 10^{-5}$ | $1.0 \times 10^{-4}$ |
| Example 4 | 0.15/0.60 | 120 | 0.7 | $8.6 \times 10^{-6}$ | $1.3 \times 10^{-5}$ |
| Example 5 | 0.16/0.62 | 120 | 0.8 | $1.6 \times 10^{-5}$ | $1.0 \times 10^{-4}$ |
| Example 6 | 0.16/0.57 | 120 | 1.1 | $9.6 \times 10^{-6}$ | $2.5 \times 10^{-5}$ |

TABLE 1-continued

| | | | | | |
|---|---|---|---|---|---|
| Example 7 | 0.14/0.60 | 50 | 0.9 | $8.0 \times 10^{-6}$ | $9.7 \times 10^{-6}$ |
| Example 8 | 0.13/0.55 | 1000 | 2.1 | $7.6 \times 10^{-6}$ | $3.3 \times 10^{-5}$ |
| Example 9 | 0.12/0.18 | 120 | 0.9 | $3.2 \times 10^{-4}$ | $6.1 \times 10^{-4}$ |
| Example 10 | 0.12/0.55 | 120 | 1.1 | $8.5 \times 10^{-6}$ | $1.4 \times 10^{-5}$ |
| Example 11 | 0.31/0.63 | 120 | 0.7 | $7.9 \times 10^{-6}$ | $9.0 \times 10^{-6}$ |
| Comparative example 1 | 0.06/0.37 | 120 | 4.7 | $5.5 \times 10^{-3}$ | $9.5 \times 10^{-3}$ |
| Comparative example 2 | | | | $4.5 \times 10^{-4}$ | $6.5 \times 10^{-4}$ |
| Comparative example 3 | 0.06/0.37 | 120 | 4.7 | $4.1 \times 10^{-4}$ | $1.4 \times 10^{-3}$ |

*Polyethylene terephthalate,
**Amorphous cyclic polyolefin

Having high gas barrier properties against oxygen gas, water vapor and other gases, the gas barrier film according to embodiments of the present invention can be used effectively for producing various products including, but not limited to, packaging materials for foodstuffs and pharmaceuticals and members of electronic devices such as thin-type TVs and solar batteries.

EXPLANATION OF NUMERALS 1. polymer base
2. inorganic layer [A]
3. silicon compound layer [B]
4. undercoat layer [C]
5. polymer base
6. take-up type sputtering equipment
7. take-up chamber
8. unwinding roller
9, 10, and 11. unwinding guide roller
12. cooling drum
13. sputtering electrode
14, 15, and 16. take-up guide roller
17. take-up roller
18. gas barrier film
19. metal cylinder
20. surface opposite to that provided with inorganic layer [A] and silicon compound layer [B]

The invention claimed is:

1. A gas barrier film comprising a polymer base having an inorganic layer [A] and a silicon compound layer [B] stacked in this order at least on one side of the polymer base, the inorganic layer [A] containing a zinc compound and silicon oxide, the silicon compound layer [B] containing silicon oxynitride, and the inorganic layer [A] and the silicon compound layer [B] being in contact with each other, wherein ZnLMM spectral curves taken by X-ray photoelectron spectroscopy from an interface region [I] in the inorganic layer [A] facing to the silicon compound layer [B] are broader than those from a central region of the inorganic layer [A], wherein a water vapor permeability of the gas barrier film in an atmosphere with a temperature of 40° C. and relative humidity of 90% RH is $7.5 \times 10^{-6}$ to $6.5 \times 10^{-5}$ g/(m²·d), obtainable by a process comprising:
   (a) forming the inorganic layer [A] containing a zinc compound and silicon oxide on a polymer base by sputtering; and
   (b) forming the silicon compound layer [B] containing silicon oxynitride on the inorganic layer [A] by spreading a coating liquid containing a silicon compound having a polysilazane backbone, then drying it to form a coat film, and subsequently applying an active energy ray to the coat film in a nitrogen atmosphere.

2. The gas barrier film as described in claim 1 wherein the polymer base and the inorganic layer [A] sandwich an undercoat layer [C] that contains a structure in the form of a crosslinked product of a polyurethane compound [C1] having an aromatic ring structure.

3. The gas barrier film as described in claim 2 wherein the undercoat layer [C] contains an organic silicon compound and/or an inorganic silicon compound.

4. The gas barrier film as described in either claim 1 wherein the inorganic layer [A] is either an inorganic layer [A1] that comprises a coexistence phase of zinc oxide, silicon dioxide, and aluminum oxide or an inorganic layer [A2] that comprises a coexistence phase of zinc sulfide and silicon dioxide.

5. The gas barrier film as described in claim 4 wherein the inorganic layer [A] is the inorganic layer [A1], the layer [Al] having a zinc atom concentration of 20 to 40 atom %, a silicon atom concentration of 5 to 20 atom %, an aluminum atom concentration of 0.5 to 5 atom %, and an oxygen atom concentration of 35 to 70 atom % as determined by ICP emission spectroscopy analysis.

6. The gas barrier film as described in claim 4 wherein the inorganic layer [A] is the inorganic layer [A2] in which zinc sulfide accounts for a mole fraction of 0.7 to 0.9 of the total for zinc sulfide and silicon dioxide.

7. The gas barrier film as described in claim 1 wherein in the silicon compound layer [B], the oxygen atom has an atomic composition ratio of 0.1 or more and less than 2.0 relative to the silicon atom and the nitrogen atom has an atomic composition ratio of 0.1 or more and less than 1.0 relative to the silicon atom based on element distributions observed by X-ray photoelectron spectroscopy.

8. An electronic device comprising gas barrier film as described in claim 1.

9. A production method for gas barrier film comprising step a for forming an inorganic layer [A] containing a zinc compound and silicon oxide on a polymer base by sputtering and step b for forming a silicon compound layer [B] containing silicon oxynitride on the inorganic layer [A] by applying a coating liquid containing a silicon compound having a polysilazane backbone, drying it to form a coat film, and subsequently applying an active energy ray to the coat film in a nitrogen atmosphere, wherein ZnLMM spectral curves taken by X-ray photoelectron spectroscopy from an interface region [I] in the inorganic layer [A] facing to the silicon compound layer [B] are broader than those from a central region of the inorganic layer [A], wherein a water vapor permeability of the gas barrier film in an atmosphere with a temperature of 40° C. and relative humidity of 90% RH is $7.5 \times 10^{-6}$ g/(m² d) to $6.5 \times 10^{-5}$ g/(m²d).

10. A production method for gas barrier film comprising a step, referred to as step c, for forming an undercoat layer

[C] on a polymer base by applying a coating liquid containing a polyurethane compound [C1] having an aromatic ring structure, drying it to form a coat film, and subsequently applying an active energy ray to the coat film in a nitrogen atmosphere, step a for forming an inorganic layer [A] containing a zinc compound and silicon oxide on the undercoat layer [C] by sputtering, and step b for forming a silicon compound layer [B] containing silicon oxide and silicon oxynitride on the inorganic layer [A] by applying a coating liquid containing a silicon compound having a polysilazane backbone, drying it to form a coat film, and subsequently applying an active energy ray to the coat film in a nitrogen atmosphere, wherein ZnLMM spectral curves taken by X-ray photoelectron spectroscopy from an interface region [I] in the inorganic layer [A] facing to the silicon compound layer [B] are broader than those from a central region of the inorganic layer [A], wherein a water vapor permeability of the gas barrier film in an atmosphere with a temperature of 40° C. and relative humidity of 90% RH is $7.5 \times 10^{-6}$ g/(m$^2$ d) to $6.5 \times 10^{-5}$ g/(m$^2$d).

* * * * *